United States Patent [19]
Takeshima et al.

[11] Patent Number: 5,796,652
[45] Date of Patent: Aug. 18, 1998

[54] NON-VOLATILE SEMICONDUCTOR MEMORY CAPABLE OF WRITING MULTI-VALUE INFORMATION

[75] Inventors: Toshio Takeshima; Hiroshi Sugawara, both of Tokyo, Japan

[73] Assignee: NEC Corporation, Tokyo, Japan

[21] Appl. No.: 773,834

[22] Filed: Dec. 27, 1996

[30] Foreign Application Priority Data

Dec. 27, 1995 [JP] Japan .................................. 7-341643

[51] Int. Cl.$^6$ .................................................. G11C 16/06
[52] U.S. Cl. ........................... 365/185.03; 365/185.23; 365/185.24
[58] Field of Search .................. 365/185.03, 185.06, 365/185.23, 185.24, 185.28, 185.33, 185.18

[56] References Cited

U.S. PATENT DOCUMENTS

| | | | |
|---|---|---|---|
| 5,412,601 | 5/1995 | Sawada et al. | 365/185.06 |
| 5,487,034 | 1/1996 | Inoue | 365/185.18 |
| 5,627,781 | 5/1997 | Hayashi et al. | 365/185.2 |

FOREIGN PATENT DOCUMENTS

| | | |
|---|---|---|
| 3-237692 | 10/1991 | Japan . |
| 7-029382 | 1/1995 | Japan . |

*Primary Examiner*—David C. Nelms
*Assistant Examiner*—Son Mai
*Attorney, Agent, or Firm*—Foley & Lardner

[57] ABSTRACT

A non-volatile semiconductor memory configured to be able to write a multi-value information into a memory cell, comprises a memory cell array composed of a number of memory cell transistors. First and second write circuits receive first and second quaternary input data, and generate first and second writing bit line voltages having a level corresponding to the value of the first and second quaternary input data, respectively. A column selection circuit selects first and second bit lines from a number of bit lines of the memory cell array, in accordance with a row address signal, and for simultaneously supplies the first and second writing bit line voltages to the selected first and second bit lines, respectively, at the time of the writing. Thus, two items of quaternary data can be simultaneously written into two memory cell transistors included in memory cell transistors of one row selected by one word line.

4 Claims, 7 Drawing Sheets

NON-VOLATILE SEMICONDUCTOR MEMORY CAPABLE OF WRITING MULTI-VALUE INFORMATION

BACKGROUND OF THE INVENTION

1. Field of the Invention

The present invention relates to a non-volatile semiconductor memory, and more specifically to a non-volatile semiconductor memory having a means for writing a multi-value information into a memory cell.

2. Description of Related Art

In the prior art, various non-volatile semiconductor memories and writing methods therefor have been proposed for writing one memory cell with one item of multi-value information which can take at least three values, for example, four values. Reference should be made to, for example, Japanese Patent Application Laid-open Publication Nos. JP-A-3-237692 and JP-A-7-029382.

In these non-volatile semiconductor memories, a memory cell is generally formed of a floating gate electric field effect transistor having a threshold electrically controlled by controlling voltages applied to a source, a drain and a gate, respectively. This transistor will be called a "memory cell transistor" hereinafter. A method for controlling the threshold of the memory cell transistor includes a method for changing the level of the applied voltage, and a method for controlling the voltage application time while maintaining the applied voltage at a constant level.

Referring to FIG. 1, there is shown a circuit diagram of a first example of the prior art non-volatile semiconductor memory configured to write the multi-value information by changing the level of the applied voltage.

The shown non-volatile semiconductor memory includes a memory cell array 1 composed of a number of memory cell transistors M11 to Mmn having an electrically controllable threshold, which are arranged in the form of a matrix having "m" rows and "n" columns. The shown non-volatile semiconductor memory also includes a plurality of word lines WL1 to WLm provided for the "m" rows of the memory cell transistors M11 to Mmn, respectively, each of the word lines WL1 to WLm being connected in common to a gate of all the memory cell transistors included in one corresponding row, and a plurality of bit lines BL1 to BLn provided for the "n" columns of the memory cell transistors M11 to Mmn, respectively, each of the bit lines BL1 to BLn being connected in common to a drain of all the memory cell transistors included in one corresponding column. A source of all the memory cell transistors M11 to Mmn are grounded.

Furthermore, the shown non-volatile semiconductor memory includes a buffer circuit 5C for holding and supplying, at the time of a writing, an input data I0 having four values, namely of a quaternary information, (for example, composed of bits I01 and I02), a writing circuit 6C for generating, at the time of the writing, a word line voltage control signal WVC corresponding to the value of the input data I01 supplied from the buffer circuit 5C, and a writing bit line voltage Vbp having a constant level, an X-decoder 2A aid a level conversion circuit 7 receiving a row address signal AX for selecting one word line in accordance with the received row address signal AX from the plurality of word lines WL1 to WLm, and for supplying, at the time of the writing, a writing word line voltage Vwp corresponding to the word line voltage control signal WVC, to the selected word line, and a Y-decoder 3A and a Y-switch circuit 4A receiving a column address signal AY for selecting one bit line in accordance with the received column address signal AY from the plurality of bit lines BL1 to BLn, and for supplying, at the time of the writing, the writing bit line voltage Vbp to the selected bit line.

Now, a writing operation of this non-volatile semiconductor memory will be described.

Information to be written is externally supplied as the input data I0 (I01, I02), which is received and held in the input buffer 5C. The writing circuit 6C performs an arithmetic operation for the input data I0 (I01, I02), and discriminates which threshold level of the memory cell transistor corresponds to the received input data I0 as the multi-value information. The writing circuit 6C generates the word line voltage control signal WVC having a value indicative of the result of the discrimination, and also the writing bit line voltage Vbp having the constant level.

The level conversion circuit 7 supplies the writing word line voltage Vwp having a level corresponding to the word line voltage control signal WVC, namely, to the value of the input data I0, to one word line selected by the X-decoder 2A. Also Y-decoder 3A and the Y-switch circuit 4A supply the writing bit line voltage Vbp to one selected bit line.

Thus, a voltage corresponding to the value of the input data I0, is applied between the gate and the drain of one memory cell transistor positioned at an intersection between the one selected word line and the one selected bit line, so that the threshold of the selected memory cell transistor becomes a level corresponding to the value of the input data I0.

Referring to FIG. 2, there is shown a graph illustrating a change of the threshold voltage Vt of the memory cell transistor when the writing word line voltage Vwp is changed in accordance with the value of the input data I0. On the other hand, a programming time Tp for applying the writing voltage between the gate and the drain of the memory cell transistor is fixed to a constant value. The writing word line voltage Vwp corresponds to the value of the input data I0, and the level relation of the writing word line voltage Vwp is Vw1<Vw2<Vw3<Vw4. When the highest level Vw4 is applied, the number of electrons injected into the floating gate of the memory cell transistor becomes maximum, so that the threshold Vt becomes the highest.

Referring to FIG. 3, there is shown a waveform diagram illustrating a voltage change on various points and the change of the thresholds (Vt) of the memory cell transistors M11 to Mmn, when the memory cell transistor M11 is programmed by applying the gate voltage (writing word line voltage) of Vw4, and then, the memory cell transistor M12 is programmed by applying the gate voltage of Vw2. As seen from FIG. 3, the programming time Tp of the number corresponding to that of the memory cell transistors to be programmed (namely, to be written with data), is required.

Incidentally, in this type non-volatile semiconductor memory, it has been explained that a multi-value information is written into the memory cell transistor by changing the writing word line voltage Vwp while maintaining the writing bit line voltage Vbp at the constant. However, it is possible to write a multi-value information into the memory cell transistor by changing the writing bit line voltage Vbp while maintaining the writing word line voltage Vwp at the constant.

Next, referring to FIG. 4, there is shown a circuit diagram of a second example of the prior art non-volatile semiconductor memory configured to write the multi-value information by changing the voltage application time while maintaining the level of the applied voltage at a constant. In FIG. 4, elements similar to those shown in FIG. 1 are given the same Reference Numerals, and explanation thereof will be omitted.

The second example of the prior art non-volatile semiconductor memory includes a write circuit 6D receiving a timing signal generated in a timing generator 8 and the input data I0 supplied through the buffer circuit 5C, for generating a writing bit line pulse signal Pbp and a writing word line pulse signal Pwp which have a constant voltage (Vbpc, Vwpc) and a pulse width corresponding to the value of the input data I0. An X-decoder 2B receives a row address signal AX for selecting one word line in accordance with the received row address signal AX from the plurality of word lines WL1 to WLm, and also receives the timing signal generated in the timing generator 8 and the writing word line pulse signal Pwp, for supplying, at the time of the writing, the writing word line pulse signal Pwp having the constant voltage Vwpc to the selected word line for a period of time corresponding to the pulse width of the writing word line pulse signal Pwp. A Y-decoder 3B and a Y-switch circuit 4A receive a column address signal AY for selecting one bit line in accordance with the received column address signal AY from the plurality of bit lines BL1 to BLn, and also receive the timing signal generated in the timing generator 8 and the writing bit line pulse signal Pbp, for supplying, at the time of the writing, the writing bit line pulse signal Pbp having the constant voltage Vbpc to the selected bit line for a period of time corresponding to the pulse width of the writing bit line pulse signal Pbp.

Thus, the writing bit line pulse signal Pbp and the writing word line pulse signal Pwp are supplied to the selected bit line and the selected word line, respectively, so that the threshold of the memory cell transistor positioned at an intersection between the selected bit line and the selected word line is brought to a value corresponding to the pulse width of these writing bit line pulse signal Pbp and writing word line pulse signal Pwp.

Referring to FIG. 5, there is shown a graph illustrating how the threshold voltage Vt of the memory cell transistor changes when the pulse width (a shorter one (Pbp in the shown example) of Pbp and Pwp, namely, programming time) is changed to Tp2, then to Tp3, and further to Tp4. FIG. 6 shows a waveform diagram illustrating a voltage change on various points and the change of the thresholds of the memory cell transistors M11 to Mmn, when the memory cell transistor M11 is programmed by applying the pulse signal having the pulse width (programming time) of Tp4, and then, the memory cell transistor M12 is programmed by applying the pulse signal having the pulse width of Tp2.

As seen from the above, in the second example of the prior art non-volatile semiconductor memory, an overall programming time is a time obtaining by summing the respective programming times of the memory cell transistors to be programmed. In the example shown in FIG. 6, the overall programming time becomes Tp4+Tp2.

Another method for writing the multi-value information by changing the voltage application time while maintaining the level of the voltage applied to the memory cell transistor at a constant, is that, as shown in FIG. 7, the writing word line pulse signal is divided into a plurality of short pulse signals having a short pulse width, and the programming time is controlled by changing the number of the short pulse signals applied to the selected word line. This modification is advantageous in that since the threshold of the memory cell transistor can be controlled by the number of the short pulse signals, the control method can be simplified, but disadvantageous in that since a pause period for applying no voltage necessarily exists between each pair of adjacent short pulse signals applied to the selected word line, the programming time inevitably becomes longer than that of the case shown in FIG. 6.

As seen from the above, the prior art non-volatile semiconductor memories have been so constructed that, in one writing operation, one memory cell transistor is selected and then programmed by applying the writing bit line voltage or pulse signal and the writing word line voltage or pulse signal corresponding to the value of the input data of the multi-value information. Therefore, in order to program a plurality of memory cell transistors, the writing operations of the number equal to the number of the memory cell transistors to be programmed, or the programming time corresponding to the number of the memory cell transistors to be programmed, is required. Therefore, a long time is required to complete programming of all the plurality of memory cell transistors.

Furthermore, in one writing operation, only one memory cell transistor of the memory cell transistors included in one row designated by the selected word line is programmed, and therefore, in order to program all the memory cell transistors included in the one row, it is necessary to conduct the writing operation of the number equal to the number of all the memory cell transistors included in the one row. The larger the number of the memory cell transistors included in each one row the higher the probability of occurrence of a write disturbance correspondingly becomes.

SUMMARY OF THE INVENTION

Accordingly, it is an object of the present invention to provide a non-volatile semiconductor memory configured to be able to write a multi-value information into a memory cell, which has overcome the above mentioned defect of the conventional ones.

Another object of the present invention is to provide a non-volatile semiconductor memory configured to be able to write a multi-value information into a memory cell, which has shortened a total writing time until a programming of a given number of memory cell transistors is completed, thereby to reduce probability of occurrence of a write disturbance.

The above and other objects of the present invention are achieved in accordance with the present invention by a non-volatile semiconductor memory configured to be able to write a multi-value information into a memory cell, comprising:

a memory cell array composed of a number of memory cell transistors having an electrically controllable threshold, arranged in the form of a matrix having a plurality of rows and a plurality of columns, a plurality of word lines provided for the plurality of rows of the memory cell array, respectively, each of the word lines being connected in common to a gate of memory cell transistors included in a corresponding row of of the memory cell array;

a plurality of bit lines provided for the plurality of columns of the memory cell array, respectively, each of the bit lines being connected in common to a drain of memory cell transistors included in a corresponding column of of the memory cell array; and means for simultaneously writing a plurality of items of multi-value information which can take at least three values, into a corresponding number of memory cell transistors included in the memory cell transistors of one row selected by one word line.

In a preferred embodiment of the non-volatile semiconductor memory, the above mentioned means includes:

a row decoder receiving a row address signal for selecting one word line in accordance with the received row address signal, from the plurality of word lines, and for supplying a writing word line voltage of a predetermined level to the selected word line at the time of a writing;

a plurality of write circuits receiving respective input data of multi-value information, for generating, at the time of the writing, a corresponding number of writing bit line voltages having a level corresponding to the value of the respective input data, respectively; and a column selection circuit receiving a column address signal for selecting from the plurality of bit lines in accordance with the received row address signal, bit lines of the same number as that of the plurality of write circuits, and for simultaneously supplying the corresponding number of writing bit line voltages generated by the plurality of write circuits, to the selected bit lines, respectively, at the time of the writing.

For example, the writing word line voltage of the predetermined level is a negative voltage, and the writing bit line voltages generated by the plurality of write circuits are a positive voltage, so that the multi-value information is written into each selected memory cell transistor by action of a Fowler-Nordheim tunneling effect.

The threshold of the memory cell transistors in an initialized condition or in an erased condition is a first voltage of a predetermined positive level, and the threshold of each written memory cell transistor is at a voltage between zero voltage and the first voltage of the predetermined positive level.

The above and other objects, features and advantages of the present invention will be apparent from the following description of preferred embodiments of the invention with reference to the accompanying drawings.

DESCRIPTION OF THE PREFERRED EMBODIMENTS

Figure 1:
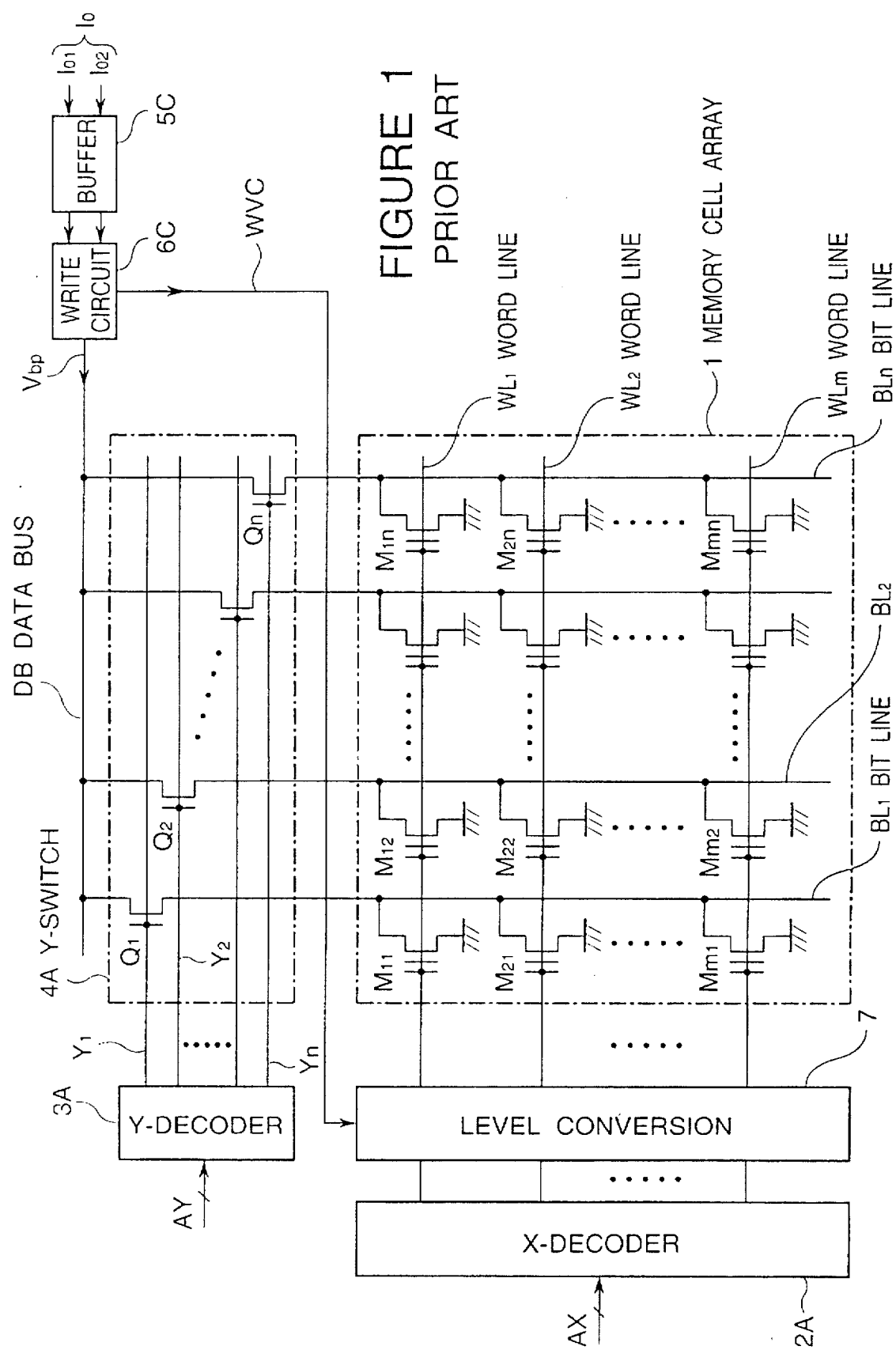
FIG. 1 is a circuit diagram of a first example of the prior art non-volatile semiconductor memory configured to write the multi-value information by changing the level of the applied voltage.
Figure 2:
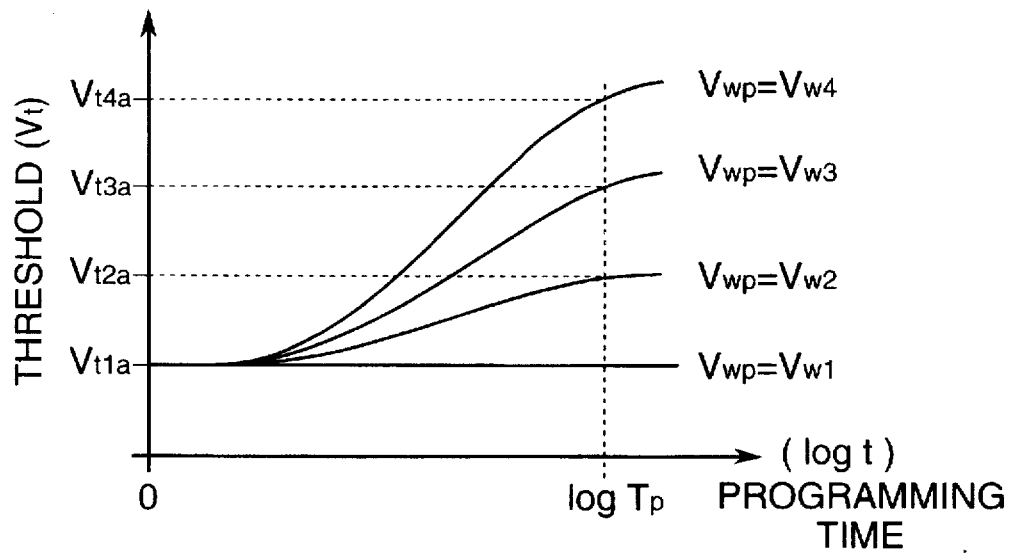
FIG. 2 is a graph illustrating a change of the threshold voltage of the memory cell transistor when the writing word line voltage is changed in accordance with the value of the input data.
Figure 3:
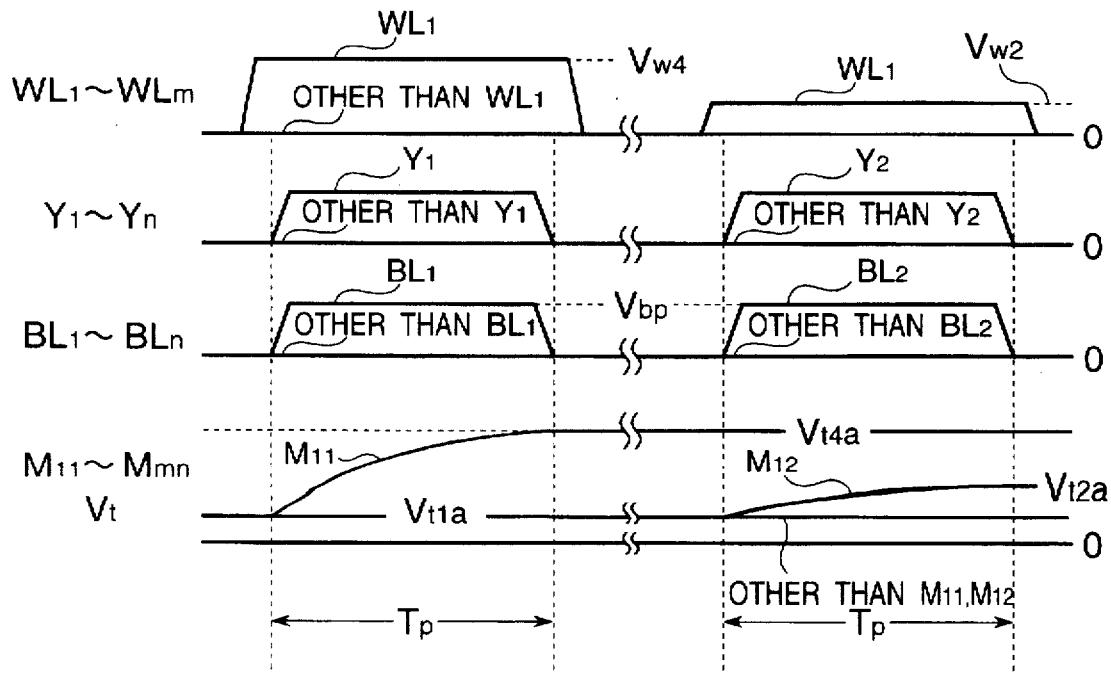
FIG. 3 is a waveform diagram illustrating a voltage change on various points and the change of the thresholds of the memory cell transistors when one memory cell transistor is programmed by applying one gate voltage, and then, another memory cell transistor is programmed by applying another gate voltage.
Figure 4:
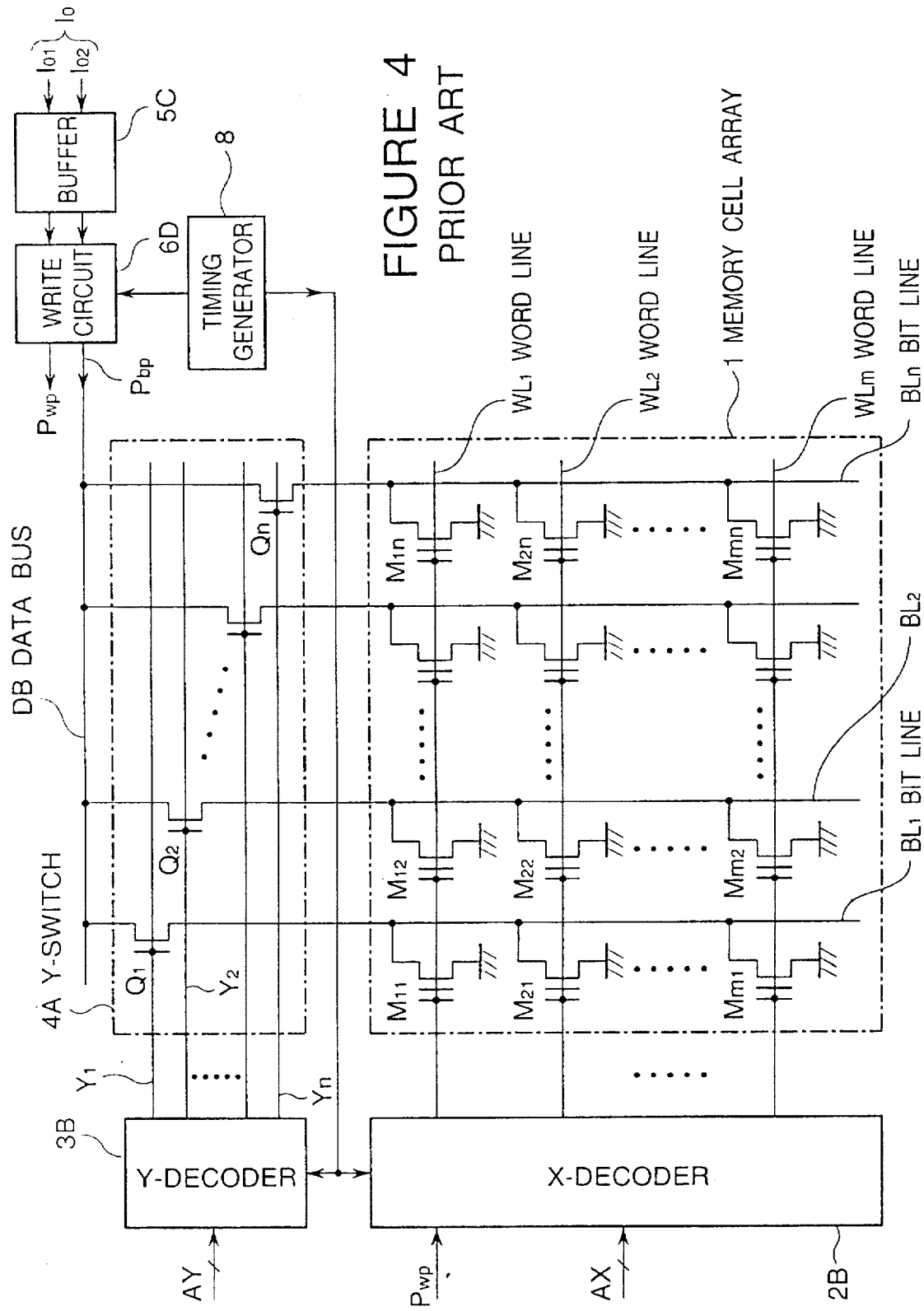
FIG. 4 is a circuit diagram of a second example of the prior art non-volatile semiconductor memory configured to write the multi-value information by changing the voltage application time while maintaining the level of the applied voltage at a constant.
Figure 5:
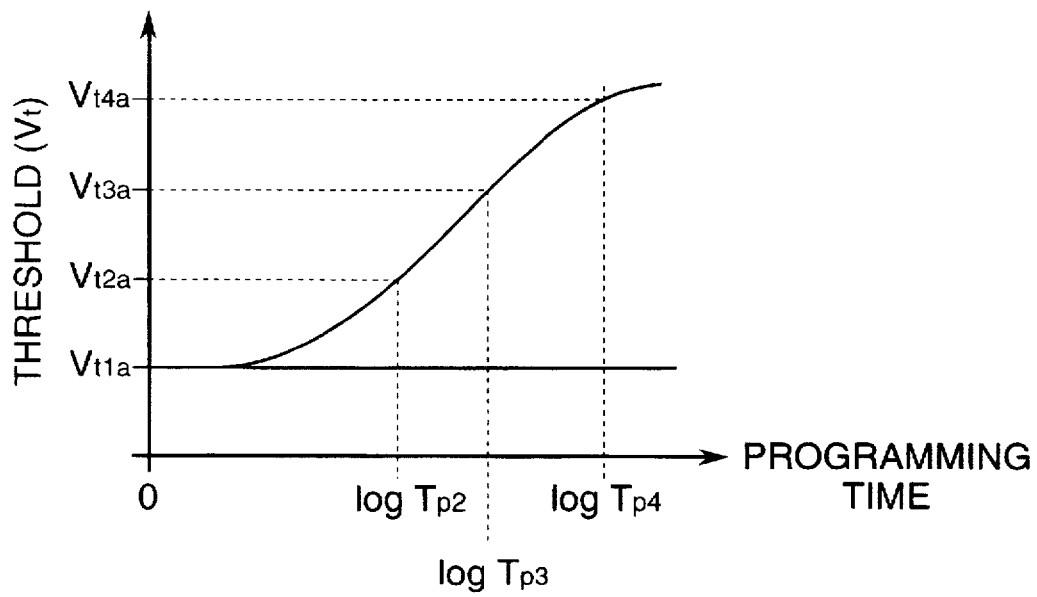
FIG. 5 is a graph illustrating the change of the threshold voltage of the memory cell transistor when the pulse width (programming time) is changed.
Figure 6:
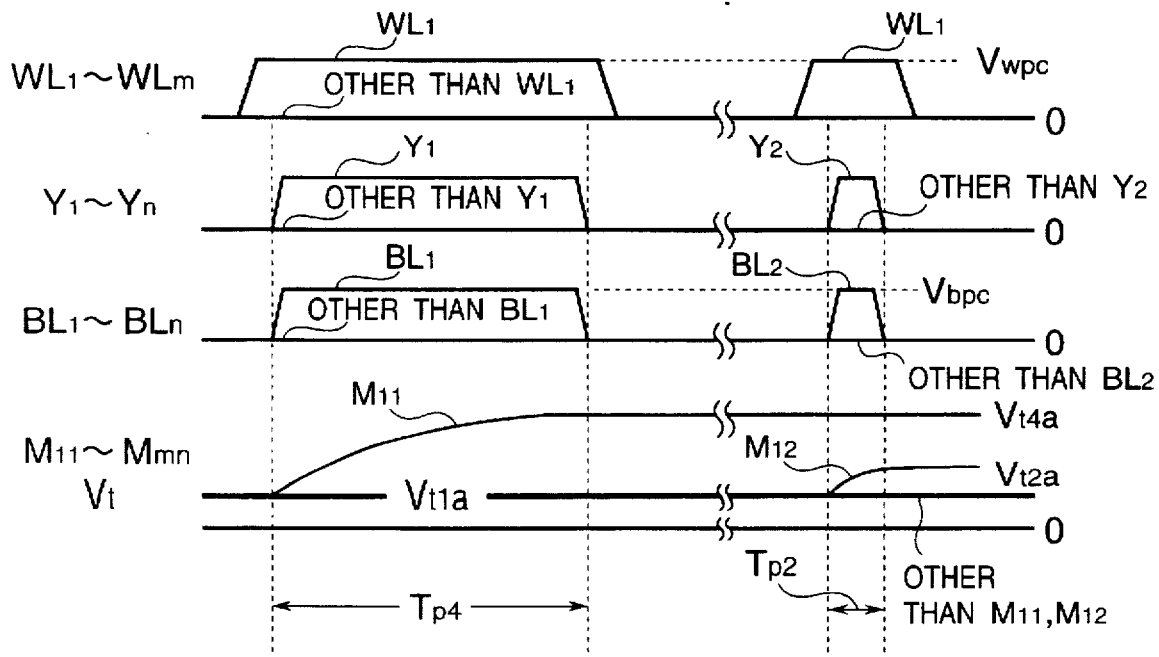
FIG. 6 is a waveform diagram illustrating a voltage change on various points and the change of the thresholds of the memory cell transistors when one memory cell transistor is programmed by applying the pulse signal having one pulse width, and then, another memory cell transistor is programmed by applying the pulse signal having another pulse width.
Figure 7:
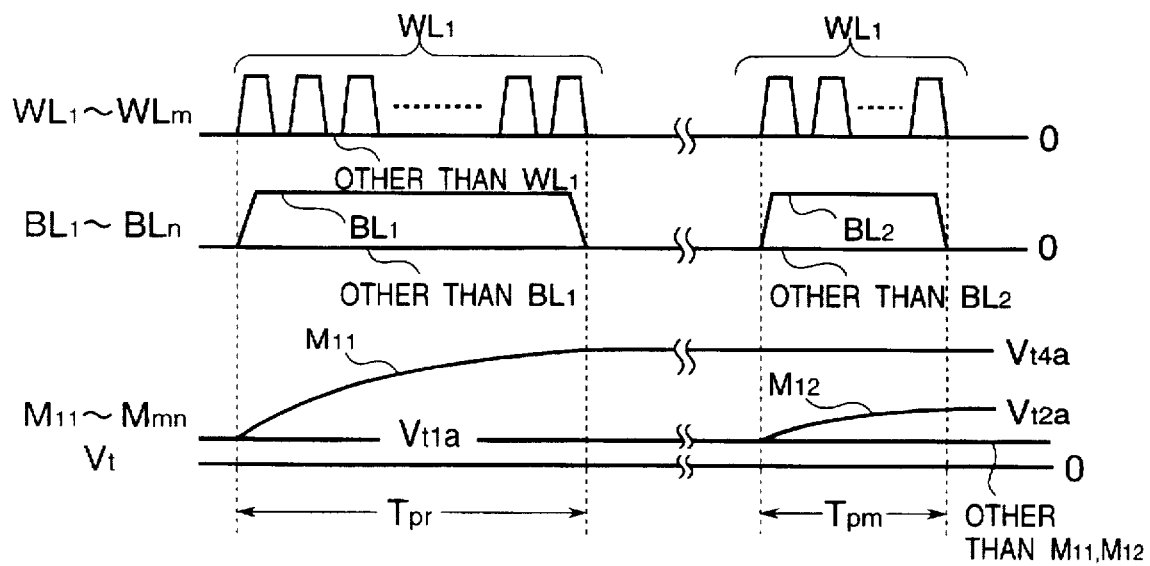
FIG. 7 is a waveform diagram similar to that of FIG. 6, but illustrating a modification of the writing method shown in FIG. 6.
Figure 8:
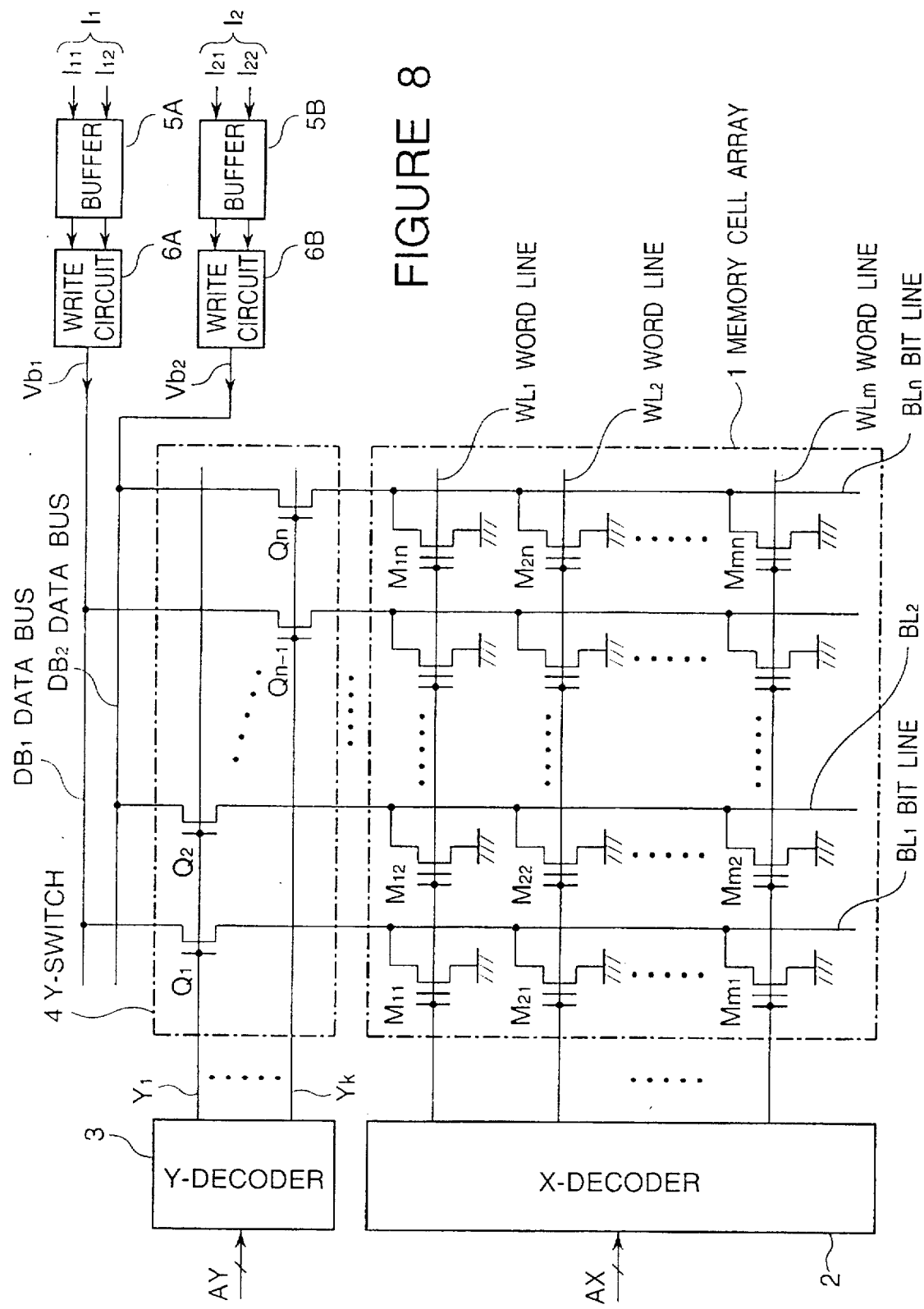
FIG. 8 is a circuit diagram of an embodiment of the non-volatile semiconductor memory in accordance with the present invention.

Referring to FIG. 8, there is shown a circuit diagram of an embodiment of the non-volatile semiconductor memory in accordance with the present invention.

The shown embodiment includes a memory cell array 1 composed of a number of memory cell transistors M11 to Mmn having an electrically controllable threshold, which are arranged in the form of a matrix having "m" rows and "n" columns. The shown embodiment also includes a plurality of word lines WL1 to WLm provided for the "m" rows of the memory cell transistors M11 to Mmn, respectively, each of the word lines WL1 to WLm being connected in common to a gate of all the memory cell transistors included in one corresponding row, and a plurality of bit lines BL1 to BLn provided for the "n" columns of the memory cell transistors M11 to Mmn, respectively, each of the bit lines BL1 to BLn being connected in common to a drain of all the memory cell transistors included in one corresponding column. The respective sources of all the memory cell transistors M11 to Mmn are grounded.

Furthermore, the shown embodiment includes an X-decoder 2 receiving a row address signal AX for selecting one word line in accordance with the received row address signal AX from the plurality of word lines WL1 to WLm, and for supplying, at the time of the writing, a negative writing word line voltage of a predetermined level to the selected word line.

In addition, the shown embodiment includes two buffer circuits 5A and 5B for holding and supplying, at the time of a writing, an input quaternary data I1 taking one of four values, (for example, composed of bits I11 and I12), and another input quaternary data I2 taking one of four values (for example, composed of bits I21 and I22), respectively, and two writing circuits 6A and 6B associated to the buffer circuits 5A and 5B, respectively, for generating, at the time of the writing, writing bit line voltages Vb1 and Vb2, respectively, corresponding to the value of the input data I1 and I2 supplied through the buffer circuits 5A and 5B.

Furthermore, the shown embodiment includes a column selection circuit composed of a Y-decoder 3 and a Y-switch circuit 4. The Y-decoder 3 receives a column address signal AY for selecting and activating one selection signal line in accordance with the received column address, from a plurality of selection signal lines Y1 to Yk. The Y-switch circuit 4 includes a plurality of switch transistors Q1 to Qn which have one end thereof connected to the bit lines BL1 to BLn, respectively. These switch transistors Q1 to Qn are grouped into a plurality of groups, each group consisting of switch transistors of the number equal to the number of the write circuits. In the shown embodiment, each group consists of a pair of switch transistors. A gate of each pair of switch transistors is connected in common to a corresponding one selection signal line, but the plurality of pairs of switch transistors are connected to different selection signal lines, respectively. For example, a first pair of switch transistors Q1 and Q2 are connected at a gate thereof to the first selection signal line Y1, and a final pair of of switch transistors Qn-1 and Qn are connected at a gate thereof to the final selection signal line Yk. In each pair of switch transistors, the other end of one switch transistor is connected to a first data bus DB1, and the other end of the other switch transistor is connected to a second data bus DB2. Thus, since the two switch transistors are connected to the selected and activated selection signal line, each two bit lines are selected in accordance with the applied column address signal AY, and therefore, each two memory cells are selected.

Figure 9:
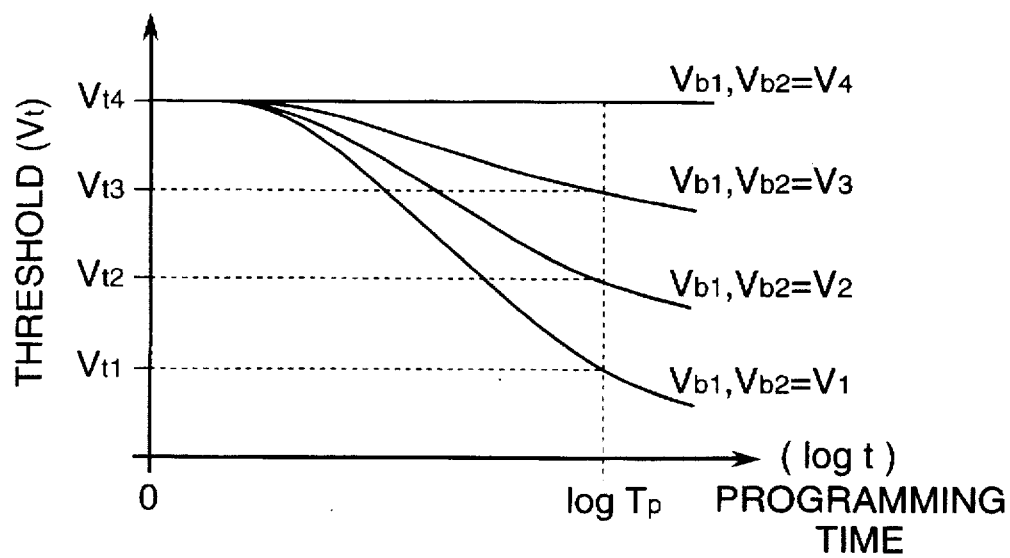
FIG. 9 is a graph showing the change of the threshold voltage of the memory cell transistor for the purpose of illustrating the principle of the operation for writing a multi-value information into a memory cell transistor in the non-volatile semiconductor memory in accordance with the present invention.

Referring to FIG. 9, there is shown a graph showing the change of the threshold voltage of the memory cell transistor in relation to the writing bit line voltages Vb1 and Vb2, for the purpose of illustrating the principle of the operation for writing a multi-value information in a memory cell transistor in the non-volatile semiconductor memory in accordance with the present invention.

Now, the principle of the operation for writing a multi-value information in a memory cell transistor will be described with reference to FIG. 9. The write circuits 6A and 6B generates the writing bit line voltages Vb1 and Vb2 having the level corresponding to the value of the input data I1 and I2, respectively. At this time, the level or voltage of each of the writing bit line voltages Vb1 and Vb2 assumes one of V1 to V4 (V1<V2<V3<V4) in accordance with the quaternary value of the input data I1 and I2.

Thus, the gate of each selected memory cell transistor is applied with the negative writing word line voltage (Vwp), and the drain of each selected memory cell transistor is applied with the writing bit line voltage (Vb1 or Vb2) which is one of the four voltages V1, V2, V3 and V4. As a result, in each selected memory cell transistor, electrons are extracted from the floating gate by action of a Fowler-Nordheim tunneling effect and in accordance with the level of the writing bit line voltage, so that the threshold voltage Vt gradually lowers. By setting the application time of the writing word line voltage and the writing bit line voltage, namely, the pulse width of these voltages (shorter one) to a predetermined time Tp (programming time), it is possible to obtain the threshold voltage Vt1, Vt2, Vt3 or Vt4, corresponding to the quaternary value of the input data I1 or I2. Incidentally, in the example shown in FIG. 9, the threshold voltage Vt4 corresponding to one of the four thresholds is the same as that in an initialized condition or in an erased condition. Therefore, the writing bit line voltage V4 corresponding to this threshold voltage Vt4 is a voltage which does not change the threshold almost.

Figure 10:
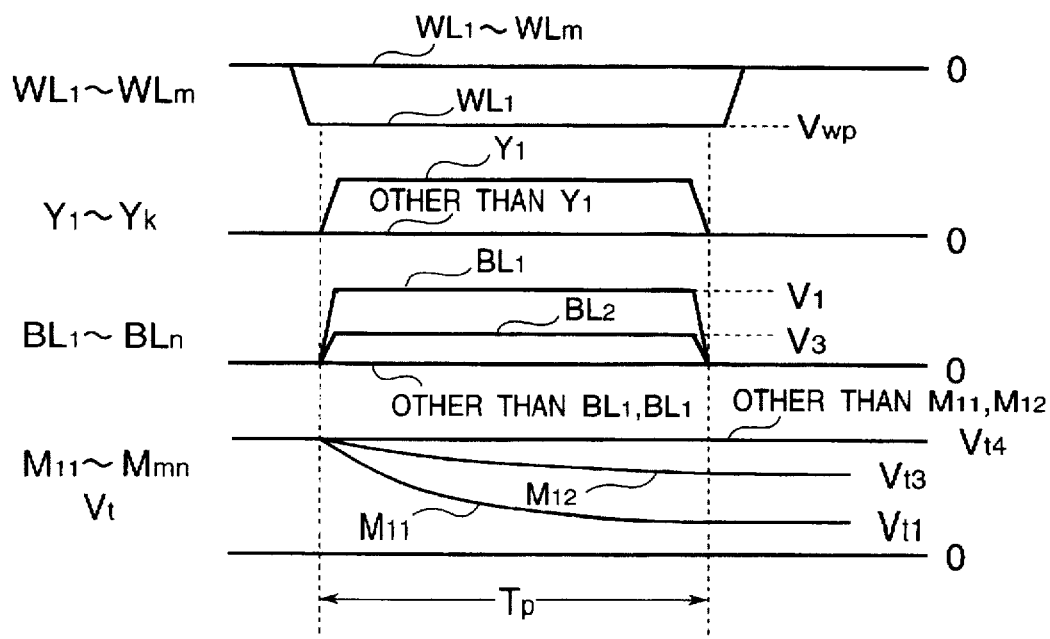
FIG. 10 is a waveform diagram illustrating a voltage change on various points and the change of the thresholds of the memory cell transistors when a plurality of items of multi-value information different from each other are written into a plurality of memory cell transistors in the non-volatile semiconductor memory in accordance with the present invention.

Referring to FIG. 10, there is shown a waveform diagram illustrating a voltage change on various points and the change of the thresholds of the memory cell transistors when a plurality of items of multi-value information different from each other are written into a plurality of memory cell transistors M11 and M12 included in a row corresponding to the word line WL1.

Input data I1 and I2 are received and held in the input buffer circuits 5A and 5B, respectively. The writing circuits 6A and 6B perform an arithmetic operation for the input data I1 and I2 supplied through the input buffer circuits 5A and 5B, respectively, and discriminate which threshold level of the memory cell transistor corresponds to the received input data I1 and I2 as the multi-value information. The writing circuits 6A and 6B respectively generate the writing bit line voltages Vb1 (for example, V1) and Vb2 (for example, V3) which correspond to the value of the received input data I1 and I2, respectively.

The X-decoder 2 selects one word line WL1 in accordance with the row address signal AX, and supplies the negative writing word line voltage Vwp to the selected word line WL1. On the other hand, since Y-decoder 3 selects one selection signal line Y1 in accordance with the column address signal AY, and brings the selected selection signal line Y1 to a selection or activated level, so that the switch transistors Q1 and Q2 are simultaneously turned on, with the result that the writing bit line voltage Vb1 (=V1) is applied to the bit line BL1, and the writing bit line voltage Vb2 (=V3) is applied to the bit line BL2.

Thus, only during a time corresponding to the pulse width Tp, the writing word line voltage Vwp is applied to the gate of the memory cell transistors M11 and M12, and the writing bit line voltages Vb1 (=V1) and Vb2 (=V3) are applied to the drain of the memory cell transistors M11 and M12, respectively. Therefore, in accordance with the characteristics shown in FIG. 9, the threshold of the memory cell transistor M11 is programmed to Vt1, and simultaneously, the threshold of the memory cell transistor M12 is programmed to Vt3.

As seen from the above, the shown embodiment can write multi-value information different from each other, into two memory cells in one writing operation. Therefore, a time until the programming (data writing) of a predetermined number of memory cell transistors is completed, can be shortened to about a half of that required in the prior art examples explained hereinbefore.

Furthermore, since the number of the writing operations required to program all the memory cell transistors included in the one row, can be shortened to about a half of that required in the prior art examples, the total time of the voltage application can be made about a half, and therefore, probability of occurrence of a write disturbance can be suppressed to a low value.

In the above mentioned embodiment, the number of the memory cell transistors which can be simultaneously written was two. If the number of the memory cell transistors which can be simultaneously written is increased, it is a matter of course that the above mentioned advantage can be further enhanced.

Furthermore, the above mentioned embodiment has been programmed by the Fowler-Nordheim tunneling effect, by applying the negative voltage as the writing word line voltage. However, it would be apparent to persons skilled in the art that, a programming method for applying a positive voltage as the writing word line voltage to cause hot electrons to be injected into the floating gate, can be applied in the present invention.

Incidentally, the circuit shown in FIG. 8 illustrates only a construction necessary to the writing operation. Since a reading operation of a multi-value information storing memory cell and a construction required therefor are well known to person skilled in the art, explanation and drawing thereof will be omitted.

As seen from the above, the non-volatile semiconductor memory in accordance with the present invention configured to be able to write a multi-value information into a memory cell, is characterized in that a plurality of items of multi-value information (taking at least three values) which may be the same or different from each other, are simultaneously written into a corresponding number of memory cell transistors included in memory cell transistors of one row designated by one selected word line. Therefore, a time until the programming (data writing) of a predetermined number of memory cell transistors is completed, can be shortened, and probability of occurrence of a write disturbance can be minimized.

The invention has thus been shown and described with reference to the specific embodiments. However, it should be noted that the present invention is in no way limited to the details of the illustrated structures but changes and modifications may be made within the scope of the appended claims.

We claim:

1. A non-volatile semiconductor memory configured to be able to write a multi-value information into a memory cell, comprising:

a memory cell array composed of a number of memory cell transistors having an electrically controllable threshold, arranged in the form of a matrix having a plurality of rows and a plurality of columns:

a plurality of word lines provided for said plurality of rows of said memory cell array, respectively, each of said word lines being connected in common to a gate of memory cell transistors included in a corresponding row of said memory cell array;

a plurality of bit lines provided for said plurality of columns of said memory cell array, respectively, each of said bit lines being connected in common to a drain of memory cell transistors included in a corresponding column of said memory cell array; and means for simultaneously writing a plurality of items of multi-value information which can take at least three values, into a corresponding number of memory cell transistors included in the memory cell transistors of one row selected by one word line.

wherein said means includes:

a row decoder receiving a row address signal for selecting one word line in accordance with the received row address signal, from said plurality of word lines, and for supplying a writing word line voltage of a predetermined level to said selected word line at the time of a writing;

a plurality of write circuits receiving respective input data of multi-value information, for generating, at the time of the writing, a corresponding number of writing bit line voltages having a level corresponding to the value of said respective input data, respectively; and a column selection circuit receiving a column address signal for selecting from said plurality of bit lines in accordance with the received row address signal, bit lines of the same number as that of said plurality of write circuits, and for simultaneously supplying said corresponding number of writing bit line voltages generated by said plurality of write circuits, to said selected bit lines, respectively, at the time of the writing.

2. A non-volatile semiconductor memory claimed in claim 1 wherein said writing word line voltage of the predetermined level is a negative voltage, and said writing bit line voltages generated by said plurality of write circuits are a positive voltage, so that the multi-value information is written into each selected memory cell transistor by action of a Fowler-Nordheim tunneling effect.

3. A non-volatile semiconductor memory claimed in claim 2 wherein the threshold of said memory cell transistors in an initialized condition or in an erased condition is a first voltage of a predetermined positive level, and the threshold of each written memory cell transistor is at a voltage between zero voltage and said first voltage of said predetermined positive level.

4. A non-volatile semiconductor memory configured to be able to write a multi-value information into a memory cell, comprising:

a memory cell array which includes a number of memory cell transistors having an electrically controllable threshold, arranged in the form of a matrix having a plurality of rows and a plurality of columns;

a plurality of word lines provided for said plurality of rows of said memory cell array, respectively, each of said word lines being connected in common to a gate of memory cell transistors included in a corresponding row of said memory cell array;

a plurality of bit lines provided for said plurality of columns of said memory cell array, respectively, each of said bit lines being connected in common to a drain of memory cell transistors included in a corresponding column of said memory cell array;

a row decoder coupled to said memory cell array and configured to receive a row address signal, said row decoder configured to select one word line in accordance with the received row address signal, from said plurality of word lines, and to supply a writing word line voltage of a predetermined level to said selected word line at the time of a writing;

a plurality of write circuits configured to receive respective input data of multi-value information which can take at least three values, said plurality of write circuits configured to generate, at the time of the writing, a corresponding number of writing bit line voltages having a level corresponding to the value of said respective input data, respectively; and a column selection circuit configured to receive a column address signal and to select from said plurality of bit lines in accordance with the received row address signal, bit lines of the same number as that of said plurality of write circuits, and to simultaneous supply said corresponding number of writing bit line voltages generated by said plurality of write circuits, to said selected bit lines, respectively, at the time of the writing.

* * * * *